US008234614B1

(12) United States Patent
Wen et al.

(10) Patent No.: US 8,234,614 B1
(45) Date of Patent: Jul. 31, 2012

(54) MULTI-THREADED GLOBAL ROUTING

(75) Inventors: Hua Wen, Mountain View, CA (US);
Hsiao-Ping Tseng, Fremont, CA (US);
Zhong Wang, San Jose, CA (US)

(73) Assignee: Synopsys, Inc., Mountain View, CA (US)

( * ) Notice: Subject to any disclaimer, the term of this patent is extended or adjusted under 35 U.S.C. 154(b) by 1031 days.

(21) Appl. No.: 12/156,963

(22) Filed: Jun. 5, 2008

(51) Int. Cl.
G06F 17/50 (2006.01)
(52) U.S. Cl. ........................................................ 716/129
(58) Field of Classification Search .................... 716/129
See application file for complete search history.

(56) References Cited

U.S. PATENT DOCUMENTS

| 6,269,469 | B1 * | 7/2001 | Pavisic et al. ................. 716/129 |
| 6,289,495 | B1 * | 9/2001 | Raspopovic et al. .......... 716/129 |
| 7,036,101 | B2 | 4/2006 | He et al. |
| 7,574,686 | B1 * | 8/2009 | Wadland et al. ............... 716/126 |
| 2002/0120912 | A1 * | 8/2002 | He et al. ........................... 716/12 |
| 2006/0190897 | A1 | 8/2006 | He et al. |
| 2007/0028201 | A1 * | 2/2007 | Mehrotra et al. ................. 716/12 |
| 2009/0070726 | A1 * | 3/2009 | Mehrotra et al. ................. 716/13 |

OTHER PUBLICATIONS

Deza et al.; "Global Routing in VLSI Design: Algorithms, Theory, and Computational Practice"; Oct. 6, 2008; McMaster University; pp. 1-25.*
Muller et al.; "Optimizing Yield in Global Routing"; Nov. 5, 2009; University of Bonn; pp. 1-7.*
Muhammet Mustafa Ozdal, et al., "Archer: A History Driven Global Routing Algorithm", 2007 International Conference on Computer Aided Design (ICAD), Nov. 4-8, 2007, pp. 488-495.
Xhaoyun Xing, et al., "A Parallel Algorithm for Timing-driven Global Routing for Standard Cells", International Conference on Parallel Processing, Aug. 10-14, 1998, pp. 54-61.

* cited by examiner

*Primary Examiner* — Suresh Memula
(74) *Attorney, Agent, or Firm* — Blakely Sokoloff Taylor & Zafman LLP

(57) ABSTRACT

A method is described for routing a semiconductor chip's global nets. The method includes identifying a subset of the global nets and routing the subset of global nets using multiple threads, where, each of the global nets within the subset are routed by one of the threads in isolation of the subset's other global nets. The method further includes identifying a second subset of the global nets and routing the second subset of global nets using the multiple threads, where, each of the global nets within the second subset are routed by one of the threads in isolation of the second subset's other global nets but in respect of the routes of first subset of global nets.

20 Claims, 6 Drawing Sheets

MULTI-THREADED GLOBAL ROUTING

FIELD OF INVENTION

The field of invention relates generally to the field of semiconductor chip design and more particularly to the routing of global nets.

BACKGROUND

Present day semiconductor chips can have tens of millions of individual wires. Sophisticated routing software programs are used to automatically route these wires. However, owing to the sheer number of wires and the complexity of the wiring, a considerable amount of time may be expended even though the routing process is automated (e.g., 24 hours or more).

Parallel processing techniques such as multi-threading have been attempted in order to reduce the routing time. The term "thread" is often used to refer to a sequential stream of program code instructions and/or the processing resources used to process such a stream. Multi-threading is the concurrent execution of more than one thread. For instance, if a computing system has two single threaded CPUs, the computing system can be configured as a multi-threaded machine that concurrently executes two separate threads.

In order to enhance the processing performance of a multi-threaded machine, threads should be able to perform their respective tasks without being dependent on one another. Said another way, each thread should be able to execute in isolation of the other thread(s). In the context of semiconductor chip routing, multi-threading can be easily applied to "detail" routing but not "global" routing.

If the surface area of a semiconductor chip is viewed as a grid of smaller surfaces or "tiles", multi-threaded routing is easily applied to the localized wires within tiles (detail routing) but not to global wires that extend across multiple tiles (global routing). With respect to detail routing, application of one thread to one tile and another thread to another tile corresponds to an environment where the two threads can operate in isolation of one another because the local wires of the first tile can not occupy the same space as the local wires of the second tile.

By contrast, with respect to global routing, many global nets could potentially occupy the same tile(s). As such, there may be interdependence between nets (because they may share the same tile(s)) and/or interdependence between tile(s) (because they may include sections of a same wiring space). These interdependencies impose difficulties when trying to impose an operating environment for multiple concurrent threads that operate in isolation of one another.

BRIEF DESCRIPTION OF THE DRAWINGS

The present invention is illustrated by way of example and not limitation in the figures of the accompanying drawings, in which like references indicate similar elements and in which.

DETAILED DESCRIPTION

The present discussion discloses an improved approach that uses multi-threading to concurrently route a plurality of global nets. As will become more clear in the description that follows, in order to effect an environment where multiple threads can operate in isolation of one another, a subset of the total global net pool (the size of which is referred to as a "window") is selected for concurrent multi-threaded routing. The window effectively "slides" over the pool of the global nets in order to route the entire pool in a multi-threaded fashion. The size of the window may also self adjust to determine an appropriate number of nets that can be concurrently routed successfully. More details are provided immediately below in reference to FIG. 1 which provides an overview of an embodiment of such a routing process.

Figure 1:
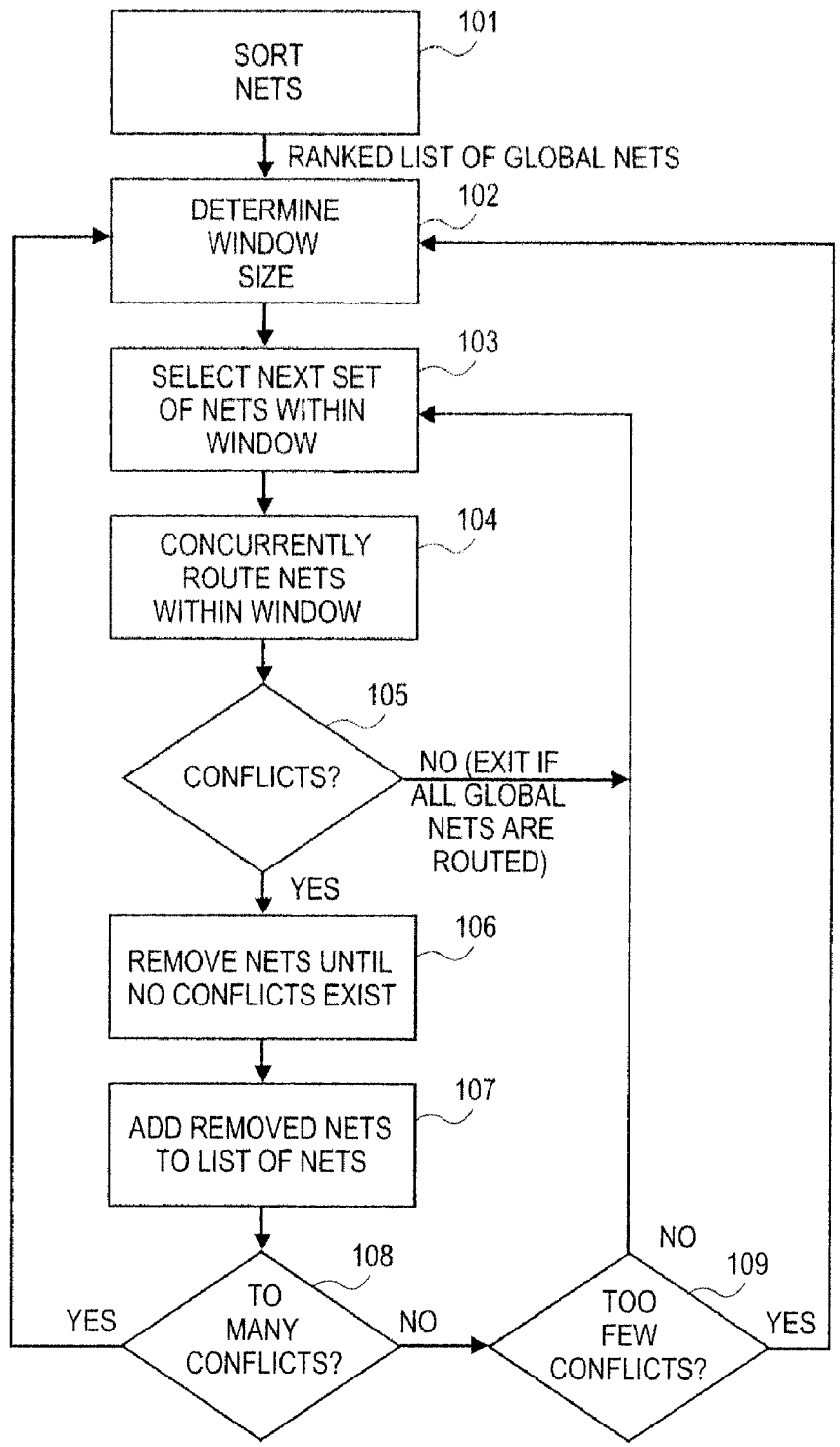
FIG. 1 shows a process for routing global nets using a multi-threaded processing approach.

According to the methodology of FIG. 1, initially, a semiconductor chip's global nets are identified and imported from a design file and then sorted 101 according to a strategy that ranks the nets according to a priority scheme. The list of nets may therefore be referred to as a sorted or ranked list of nets. A window size is also determined 102. The window size is a specific number of nets. As observed in FIG. 1, a number of nets equal to the window size is selected 103 from the "top of" the ranked net list and concurrently routed 104 by a multi-threaded processing unit.

After the window of nets is concurrently routed the constituent nets are checked for conflicts 105. As described in more detail below, a conflict exists if two or more routed nets occupy a same region of the semiconductor chip. Here, in an embodiment, individual nets within a window are routed in isolation from one another. That is, within a window of nets that are concurrently routed, a net's routing is undertaken without reference to the routing of other nets within the same window. As such, there exists some probability that two nets from the same window will be "in conflict". That is, they impermissibly occupy the same chip surface region.

If such conflicts are detected 105, one or more nets are strategically eliminated such that the conflicts are eliminated 106. The nets whose routes were eliminated 106 are then placed "back on top" of the ranked list 107 for, in one embodiment, immediate selection within the next window of concurrently routed nets. Depending on the number of conflicts that are detected 108, the window size may be adjusted downward 102 to reduce the number of conflicts expected from the next window. Likewise, according to one optional approach, if too few conflicts are detected 109 (e.g., if no conflicts are detected), the window size may be expanded 102 to include more nets for the next window. In another alternate embodiment, a globally routed net could have a section of it that is in-conflict re-routed around the tile with the conflict.

Figure 2:
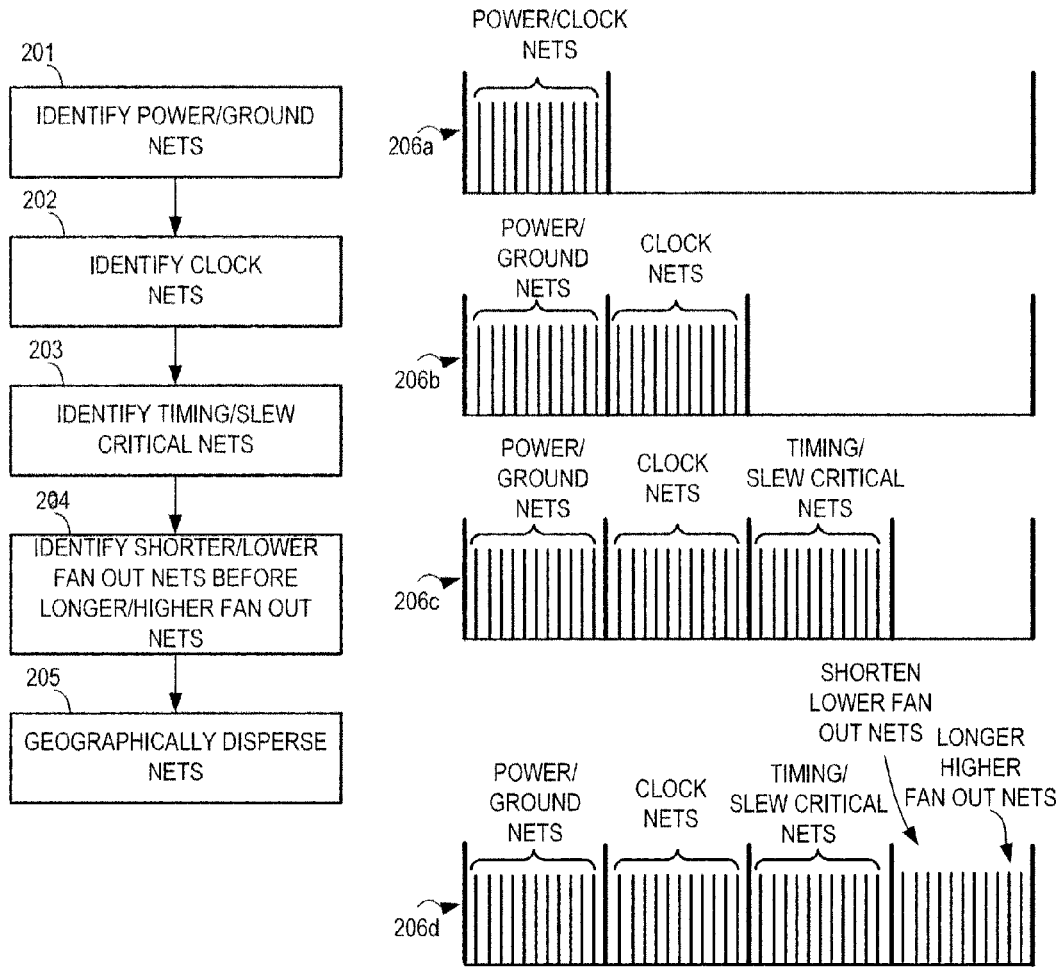
FIG. 2 shows a process for ranking global nets.

FIG. 2 shows an exemplary embodiment of a methodology for sorting nets 101. According to the sorting embodiment of FIG. 2, first, power or ground nets are selected 201. That is, power/ground nets are identified as the highest priority nets to be routed before other nets. Generally speaking, electronic circuits desire "clean" power supply and ground voltage rails. Too much resistance along a power supply node or ground node promotes the formation of undesired voltage level differences along the node. By choosing to route power/ground nets first, "shorter" power/ground route lengths will be designed into the semiconductor chip which, in turn, should lower the IR drop along these nodes.

After the power/ground nets are identified, clock nets are identified 202. The operation of a semiconductor chip can often be viewed as a number of carefully synchronized sub-processes. Clock signals are used to control the timing of these processes. For instance, a clock signal may be used to trigger when a sub process starts or stops, and/or, how fast the sub-process operates. A clock net is a wire that transports a clock signal. Generally, similar to power/ground nodes, a "clean" clock signal corresponds to precise synchronization/timing and/or fast execution of processes within the semiconductor chip during its operation. As such, routing the clock signal nets directly after the power/ground signal nets promotes the formation of clean clock signals within the semiconductor chip. This, in turn, promotes the speed and/or precision at which the chip's sub-processes will operate.

After the clock nets are identified, timing/slew critical nets are identified 203. The motivation for prioritizing timing/slew critical nets is similar to that of clock nets. The performance of a semiconductor chip is often judged by "how fast" the chip operates. As discussed above, clock signals may control the speed of the chip's internal processes and, often, a number of clock signals are high frequency signals (some of which may be the highest frequency signals used by the chip). Other signals may also exist on the chip that are not clock signals but nevertheless should be "fast". Such nets are referred to as timing/slew critical nets. The speed of a signal can be measured, for instance, by the rise times and/or fall times of its logic levels and/or its propagation delay from one end of the net to another end of the net. Because various factors—such as an extensive wire length—can adversely affect the quality of a timing/slew critical signal, timing/slew critical nets are prioritized after the clock signal nets.

After, the power/ground, clock and timing/slew critical nets are identified 201/202/203, the remainder of the chip's nets are identified 204. According to the specific embodiment of FIG. 2, the remaining nets are further sorted such that shorter and lower fan-out nets are routed before longer and higher fan-out nets (on the theory that shorter and lower fan-out nets are more difficult to re-route if involved in a conflict). Here, to accomplish this sorting, a factor is calculated that weighs both a net's length and fan-out. For example, a first number is used to gauge a net's length and a second number is used to gauge the net's fan-out. The product or summation of the two numbers determines the net's factor. The nets can then be sorted based on the factor.

Insets 206a thru 206d depict the construction of a prioritized list according to the criteria described just above. That is, inset 206a depicts the identification of the power/ground nets, inset 206b depicts the identification of the clock nets after the power/ground nets in the priority/ranking scheme, inset 206c depicts the identification of the timing/slew critical nets after the clock nets and inset 206d depicts the identification of the shorter/lower fan-out nets after the timing/slew critical nets. It is important to point out that, although a physical list of such nets ordered by priority as suggested by inset 206a-d can be implemented—there is no requirement to do so.

That is, for instance, the ranking can be recorded in a net list that physically lists nets by ID number (e.g., by simply listing for each net which category it belongs to (power/ground, clock, etc.)). In this case, the sorting/ranking information is embedded in the net list—but the netlist itself is not physically "re-arranged" according to the sorting/ranking. Here, for purposes of the present application the term "list" simply means any data formulation or structure from which the ranking can be deemed. This would include both a physically rearranged list as well as a standard net list with embedded ranking information. It also pertinent to point that other ranking schemes can be employed (e.g., that prioritize differently and/or use different parameters as a basis for ranking such as timing slack, etc.). The ranking scheme of FIG. 1 is just one possible approach.

Referring back to FIG. 1, once the ranked list of nets is created 101, the window size is determined 102. In an embodiment, the window size is based on the number of threads within the processing unit that will concurrently route the nets. For instance, the window size may be set equal to the number of threads multiplied by some factor. Thus, if the factor is 10 and there are four threads in the processing unit, the window size is set to 40 nets.

Figure 3:
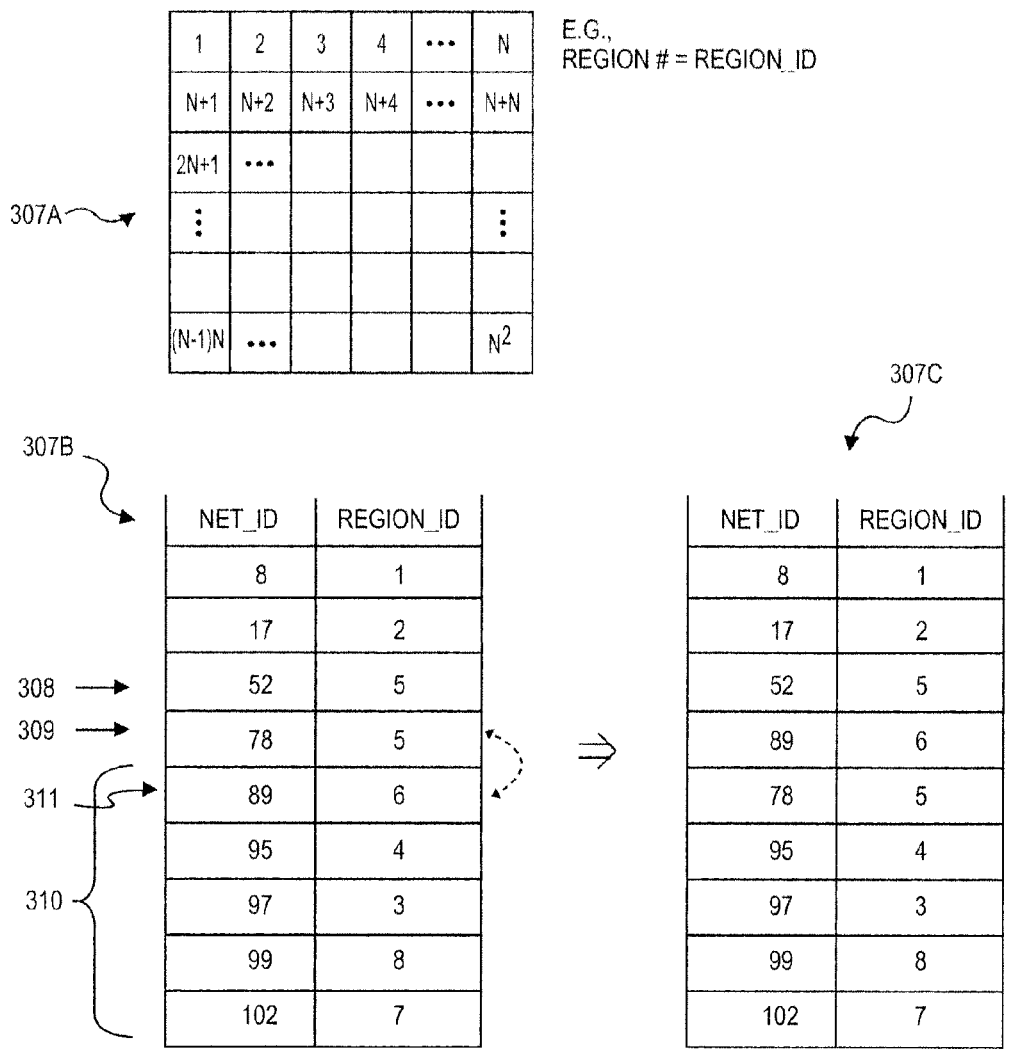
FIG. 3 shows a process for geographically dispersing global nets.

A number of nets equal to the window size is then selected, in order, from the ranked list 103. According to one embodiment, observed in FIG. 3, a pre-processing "tweak" is applied to the ranked nets within the window that geographically diversifies the nets across the chip surface them from list entry to list entry. Geographic diversification of neighboring nets within the window helps to avoid routing conflicts that might otherwise result from the concurrent routing process 104. Insets 307a through 307c of FIG. 3 illustrate an embodiment of the diversification process in more detail.

Inset 307a shows the semiconductor chip being divided into an N×N grid of $N^2$ regions. In an embodiment, each region contains multiple "tiles" (i.e., a semiconductor chip contains more tiles than regions). Inset 307b shows a portion of a selected window's ranked list that includes both an identification of the net (NET_ID) and the identification of a region (REGION_ID) in which an all endpoint terminals or "pins" of the net (which typically corresponds to a location of a contact to a transistor that is coupled to the net) is located. In a further embodiment, nets that run within more than one region are given a special REGION_ID value (such as REGION_ID=0).

Starting from the top (highest priority) of the window's ranked list 307b and scanning the entries sequentially, if neighboring entries are found to have the same REGION_ID, such as entries 308 and 309, a look-ahead scan is performed over the immediately following entries 310 for the first net 311 that has a different REGION_ID. Entry 311 is then swapped with entry 309 as observed in inset 307c. By geographically diversifying neighboring nets within the window the probability is reduced that two nets that touch the same region will conflict with one another during the concurrent routing process 104. Alternatively, techniques other than pure swapping may be employed to accomplish geographic diversification of the nets. For instance, if two neighboring global nets have the same REGION_ID, one of them may be pushed deeper into the ranked list causing those above it to be pushed upward one location.

Figure 4:
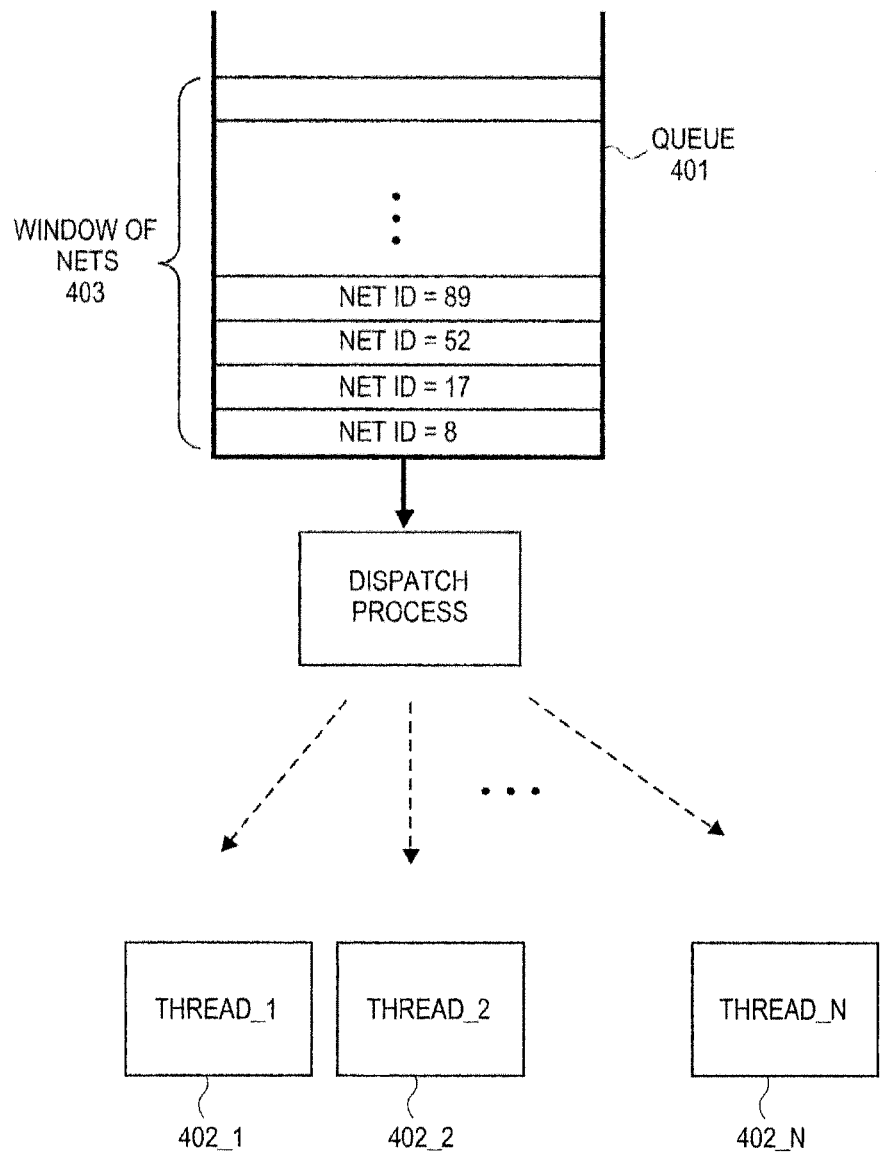
FIG. 4 shows an architecture for routing global nets using a multi-threaded processing approach.

The nets within the window are then concurrently routed 104. FIG. 4 shows an architectural depiction of the concurrent routing process. According to the depiction of FIG. 4 the window of nets 403 can be viewed as being located within a queue 401 in order. That is, the highest priority nets within the window are at the bottom of the queue 401 and the lowest priority nets within the window are at the top of the queue 401 so that higher priority nets issue from the queue 401 before lower priority nets. Note that in certain embodiments nets within a same net category, such as "power/ground", may be viewed as being equal priority. Nevertheless, at least in cases where a category boundary exists within the window, nets from the higher priority category will be issued from the queue before the nets from the lower priority category. For instance, if the ranking scheme of FIG. 2 is employed, power/ground nets will issue from the queue before clock nets.

Nets issue from the queue 401 and are dispatched to threads 402_1 through 402_N for routing. The general depiction of FIG. 4 indicates the existence of N threads. Hence, initially, N nets will issue to the N threads—one net per thread. In an embodiment, each thread routes its respective net in isolation from the other nets within the net's window but not previously routed windows. For instance, as a simple example, assume a first window of nets is concurrently routed. Then, the next—second—window of nets is selected from the ranked net list. The nets within the second window are routed so as not to conflict with the routed nets from the first window. However, in an embodiment, the nets within the second window are routed in isolation of one another. As such, no conflicts should exist between nets within the first window and nets within the second window. However, conflicts may exist between nets within the second window.

The different threads may complete the routing of their respective nets at different times (e.g., a less complex route may take less time to complete than a more complex route). As such, nets are "dispatched" from the queue 401 to the threads as the threads become available in lieu of the amount of time it takes the threads to complete their respective routes. For instance, in a system with four threads, the first four nets in the queue 401 will initially issue across the first four threads. The four threads then concurrently route the four nets. If the third thread finishes its route before the others, the fifth net from the queue 401 will issue to the third thread which concurrently routes it with the other three nets still be processed. If the second thread is next to finish, the sixth net from the queue 401 will issue to the second thread. Thus, nets issue to threads as the threads become available. Which nets are currently being routed in parallel therefore depends on the specific sequence at which the threads finish routing their respective nets.

Figure 5:
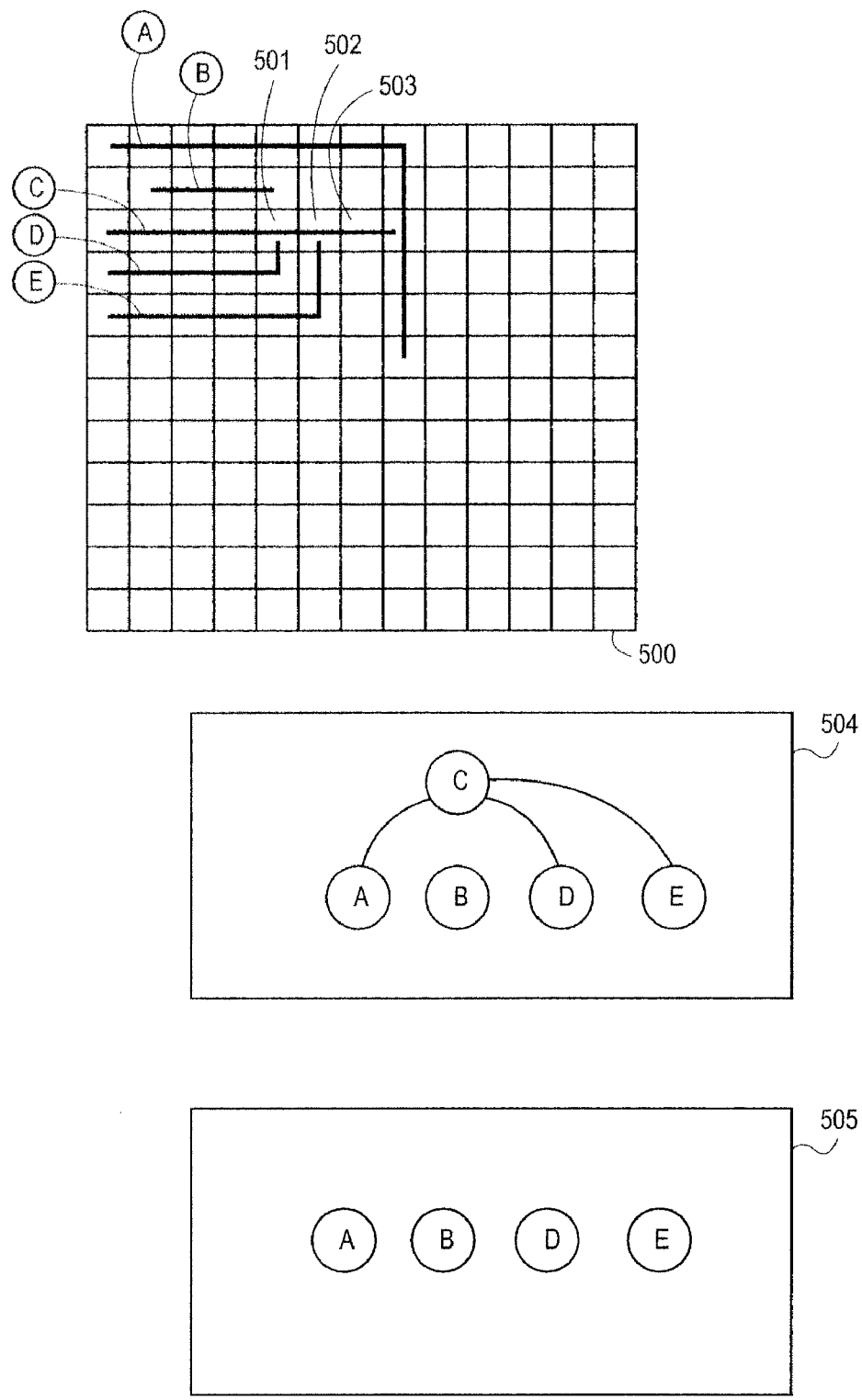
FIG. 5 shows a process for removing conflicts from a group of routed nets.

Eventually all the nets within the window will be routed. Referring back to FIG. 1, the results are checked for conflicts 105. FIG. 5 provides a simple example that demonstrates how conflicts may be detected 105 and resolved 106, 107. FIG. 5 assumes a simple example where the window size is only 5. As such when the concurrent routing of the window is complete there are 5 routed nets. Inset 500 shows an exemplary depiction of the 5 routed nets A, B, C, D and E mapped against tiles of the semiconductor chip.

Here, net C is observed to occupy surface area capacity within tiles whose surface is also occupied by other nets. Specifically, net C occupies: 1) tile 501 with net D; 2) tile 502 with net E; and, 3) tile 503 with net A. According to one embodiment, if a wire shares a tile with another wire, a conflict is flagged between the two wires. Thus, in the exemplary depiction 500 of FIG. 5, there exist three conflicts—one conflict in each of tiles 501, 502 and 503. According to a further embodiment, a graph theory approach is utilized to strategically remove the conflicts so that particularly troublesome routes are discarded (and their corresponding nets identified for selection in the next window). By discarding the troublesome nets, most of the effort undertaken concurrently routing an entire window of nets is preserved. That is, an attempt is made to preserve as many conflict free routes as possible.

Insets 504 and 505 show a simplistic demonstration of a graph theory approach used to eliminate the conflict situation of inset 500. Inset 504 shows a graph constructed from the conflict situation of inset 500. A node is represented for each routed net. Thus, inset 504 shows separate nodes for each of nets A, B, C, D and E. Each conflict is represented by an "edge" or line that connects two routes in conflict. Thus, recalling that net C is deemed to be in conflict with each of nets A, D and E, note that inset 504 shows three lines that respectively connect node C with nodes A, D and E. According to the graph theory algorithm, nodes are ranked by the number of edges connected to them. Here, node C is ranked above the other three nodes A, B, D and E because node C has three edges. Nodes A, D and E are next ranked equally because each has one edge. Node B is ranked at the bottom because it does not contain any edges.

Once the nodes are ranked by edge count, the node with the highest number of edges is eliminated. When a node is eliminated, each of its edges are eliminated. Inset 504 shows the result when node C is eliminated. Note that all edges have been eliminated—therefore all conflicts between routes have been eliminated. Thus, the graph theory approach of insets 504, 505 demonstrate that, with respect to the situation of inset 500, elimination of route C results in all the remaining routes A, B, D and E being preserved without any conflicts among them. Thus, in this simple example, referring back to FIG. 1, execution of processes 105 and 106 results in the routes for nets A, B, D and E being preserved from the previous, concurrent window routing 104 cycle. The route for net C is eliminated resulting in net C being added to the top of the ranked list for selection in the next window 103.

Note that the example of FIG. 5 simplistically assumes that multiple routes cannot exist within the same tile. In fact, in one embodiment, multiple nets within a same tile is permitted. Here, each tile is modeled so as to contain a "bucket" of track resources. Each time a net is routed through a tile a unit of track resources is subtracted from the bucket amount. For instance, if a tile has an initial bucket of 10 track resources and a net is routed through the tile, the tile is flagged as having 9 remaining track resources. If another net is routed through the tile the remaining track resources for the tile is set equal to 8, etc.

According to this approach, when constructing the conflict edges in the graph, there exist "permissible" conflicts and "impermissible" conflicts. That is, when the resource consumption of a permissible conflict is accounted for, the tile's track resources are not below 0 (i.e., the tile has enough resources to entertain the route). By contrast, when an impermissible conflict is accounted for, the remaining track resources are below 0 (i.e., the tile does not have enough resources to entertain the route). As such, when ranking the nodes in the graph for elimination, nodes having more impermissible conflicts are ranked above nodes having less impermissible conflicts. When only permissible conflicts remain in the graph, the node elimination process is complete. Alternatively, only impermissible conflicts are recorded as edges in the graph and the process of node elimination is the same as originally described with respect to insets 504, 505 of FIG. 5. That is, nodes having more conflicts are ranked above nodes having less conflicts. Nodes are eliminated in sequence according to this ranking until all conflicts are eliminated from the graph.

It is pertinent to point out that although the immediately preceding discussion focused on a tile as being the semiconductor region where multiple routes trigger a conflict, conceivably, other regions (e.g., smaller or larger than a tile) may also be used.

Referring again to FIG. 1, once the conflicts have been eliminated from the window of nets that were concurrently routed, an inquiry is made to see if the concurrent routing cycle produced too many conflicts 108. If so, the window size is reduced 102 before the next window of nets is selected 103. In this manner the routing process adjusts to a more efficient window size. That is, the time savings associated with concurrent routing of multiple nets is offset each time a conflict is detected because additional time is spent re-routing the net during the concurrent routing of the next window. Ideally, no conflicts are detected and therefore no additional time is wasted re-routing nets. Different schemes may be used to determine whether or not too many conflicts exist. According to a number of possible of embodiments, however, the formula that is used to calculate the threshold of conflicts deemed "too many" includes the number of threads as an input parameter. In the simplest case, the threshold is set equal to the number of threads.

The algorithm of FIG. 1 adapts the window size 108, 102 in an attempt to minimize the number of conflicts that will result when a window of nets is concurrently routed. Speaking loosely, the algorithm should settle on small window sizes for difficult routing jobs, large window sizes for easy routing jobs and medium window sizes for moderately difficult routing jobs. Any number of window reduction size algorithms can be employed to reduce the window size. According to one approach, the window size is initially set to a factor of the number of threads within the system (e.g., initial window size=10(# threads)) and the window size is reduced by lowering the factor (e.g., the first downward window resizing results in a window size of 9(# threads), the second downward window resizing results in a window size of 8(# threads) . . . ).

FIG. 1 also shows an optional process whereby the window size may be increased if the concurrent routing of a window does not produce any conflicts 109, 102. Here, some form of intelligence may be built into the window reduction/expansion process 108, 109, 102 such that an attempt is made to settle the window size within a range above which too many conflicts are expected and below which not enough nets are being concurrently routed.

Processes taught by the discussion above may be performed with program code such as machine-executable instructions that cause a machine that executes these instructions to perform certain functions. In this context, a "machine" may be a machine that converts intermediate form (or "abstract") instructions into processor specific instructions (e.g., an abstract execution environment such as a "virtual machine" (e.g., a Java Virtual Machine), an interpreter, a Common Language Runtime, a high-level language virtual machine, etc.)), and/or, electronic circuitry disposed on a semiconductor chip (e.g., "logic circuitry" implemented with transistors) designed to execute instructions such as a general-purpose processor and/or a special-purpose processor. Processes taught by the discussion above may also be performed by (in the alternative to a machine or in combination with a machine) electronic circuitry designed to perform the processes (or a portion thereof) without the execution of program code.

An article of manufacture may be used to store program code. An article of manufacture that stores program code may be embodied as, but is not limited to, one or more memories (e.g., one or more flash memories, random access memories (static, dynamic or other)), optical disks, CD-ROMs, DVD ROMs, EPROMs, EEPROMs, magnetic or optical cards or other type of machine-readable media suitable for storing electronic instructions. Program code may also be downloaded from a remote computer (e.g., a server) to a requesting computer (e.g., a client) by way of data signals embodied in a propagation medium (e.g., via a communication link (e.g., a network connection)).

Figure 6:
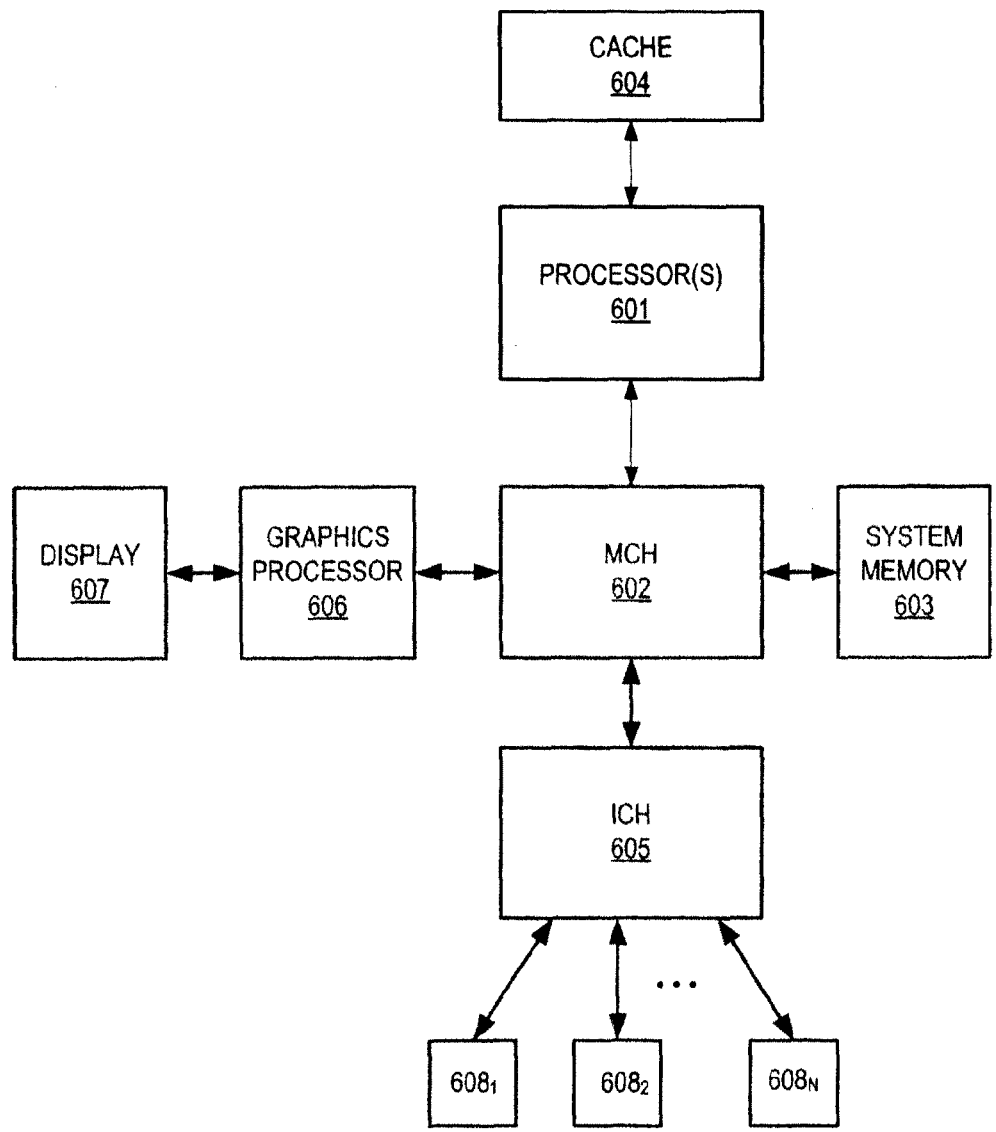
FIG. 6 shows a computing system.

FIG. 6 shows an embodiment of a computing system (e.g., a computer). The exemplary computing system of FIG. 6 includes: 1) one or more processors 601 (in the case of single threaded processors there should be more than one processor, in the case of multi-threaded processors one or more processors should be sufficient); 2) a memory control hub (MCH) 602; 3) a system memory 603 (of which different types exist such as DDR RAM, EDO RAM, etc,); 4) a cache 604; 5) an I/O control hub (ICH) 605; 6) a graphics processor 606; 7) a display/screen 607; and, 8) one or more I/O devices 608.

The one or more processors 601 execute instructions in order to perform the software routines the computing system implements. The instructions frequently involve some sort of operation performed upon data. Both data and instructions are stored in system memory 603 and cache 604. Cache 604 is typically designed to have shorter latency times than system memory 603. For example, cache 604 might be integrated onto the same silicon chip(s) as the processor(s) and/or constructed with faster SRAM cells whilst system memory 603 might be constructed with slower DRAM cells. By tending to store more frequently used instructions and data in the cache 604 as opposed to the system memory 603, the overall performance efficiency of the computing system improves.

System memory 603 is deliberately made available to other components within the computing system. For example, the data received from various interfaces to the computing system (e.g., keyboard and mouse, printer port, LAN port, modem port, etc.) or retrieved from an internal storage element of the computing system (e.g., hard disk drive) are often temporarily queued into system memory 603 prior to their being operated upon by the one or more processor(s) 601 in the implementation of a software program. Similarly, data that a software program determines should be sent from the computing system to an outside entity through one of the computing system interfaces, or stored into an internal storage element, is often temporarily queued in system memory 603 prior to its being transmitted or stored.

The ICH 605 is responsible for ensuring that such data is properly passed between the system memory 603 and its appropriate corresponding computing system interface (and internal storage device if the computing system is so designed). The MCH 602 is responsible for managing the various contending requests for system memory 603 access amongst the processor(s) 601, interfaces and internal storage elements that may proximately arise in time with respect to one another.

One or more I/O devices 608 are also implemented in a typical computing system. I/O devices generally are responsible for transferring data to and/or from the computing system (e.g., a networking adapter); or, for large scale non-volatile storage within the computing system (e.g., hard disk drive). ICH 605 has bi-directional point-to-point links between itself and the observed I/O devices 608.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

We claim:

1. A method of routing a semiconductor chip's global nets, comprising:
    ranking said semiconductor chip's global nets, wherein said ranking includes at least one of the following:
        ranking power/ground nets over clock signal nets;
        ranking power/ground nets over timing/slew critical nets;
        ranking clock signal nets over timing/slew critical nets;
        ranking shorter length and lower fan-out nets over longer length and higher fan-out nets;
    identifying a subset of said global nets;
    routing said subset of global nets using multiple threads, each of said global nets within said subset routed by one of said threads in isolation of said subset's other global nets;
    identifying a second subset of said global nets;

routing said second subset of global nets using said multiple threads, each of said global nets within said second subset routed by one of said threads in isolation of said second subset's other global nets but in respect of the routes of said subset of global nets.

2. The method of claim 1 further comprising geographically dispersing said subset of global nets prior to said routing of said subset of global nets.

3. The method of claim 2 further comprising geographically dispersing said second subset of global nets prior to said routing of said second subset of global nets.

4. The method of claim 1 wherein said routing said subset of global nets further comprises issuing each of said global nets to one of said threads because said one thread is available.

5. The method of claim 1 further comprising after said routing of said subset of global nets and before said routing of said second subset of global nets:
   detecting a conflict between a first net and a second net, said first and second nets within said first subset of global nets;
   eliminating said first net's route; and,
   including said first net in said second subset of global nets.

6. The method of claim 5 further comprising detecting conflicts using a graph theory approach.

7. The method of claim 6 wherein said graph theory approach further comprises mapping nets to nodes, mapping conflicts to edges and prioritizing said nodes based on their respective edge count.

8. The method of claim 5 further comprising flagging the following as a condition precedent to said detecting:
   surface area resources of a surface area region of said semiconductor chip through which said first and second nets' routes flow have been exceeded.

9. The method of claim 8 wherein said surface area region is a tile.

10. The method of claim 1 further comprising after said routing of said subset of global nets and before said identifying said second subset of global nets:
    detecting a conflict between a first net and a second net, said first and second nets within said first subset of global nets;
    said identifying of said second subset of said global nets including said second subset having less global nets than said first subset.

11. The method of claim 1 further comprising after said routing of said subset of global nets and before said identifying said second subset of global nets:
    detecting a conflict between a first net and a second net, said first and second nets within said first subset of global nets;
    said identifying of said second subset of said global nets including said second subset having more global nets than said first subset.

12. A non transitory machine readable storage medium having program code stored thereon that when executed by a machine causes a method to be performed, said method comprising:
    ranking said semiconductor chip's global nets, wherein said ranking includes at least one of the following:
    ranking power/ground nets over clock signal nets;
    ranking power/ground nets over timing/slew critical nets;
    ranking clock signal nets over timing/slew critical nets;
    ranking shorter length and lower fan-out nets over longer length and higher fan-out nets;
    identifying a subset of global nets;
    routing said subset of global nets using multiple threads, each of said global nets within said subset routed by one of said threads in isolation of said subset's other global nets;
    identifying a second subset of said global nets;
    routing said second subset of global nets using said multiple threads, each of said global nets within said second subset routed by one of said threads in isolation of said second subset's other global nets but in respect of the routes of said first subset of global nets.

13. The machine readable medium of claim of claim 12 wherein said method further comprises geographically dispersing said subset of global nets prior to said routing of said subset of global nets.

14. The machine readable medium of claim of claim 12 wherein said method further comprises after said routing of said subset of global nets:
    detecting a conflict between a first net and a second net, said first and second nets within said subset of global nets;
    eliminating said first net's route; and,
    including said first net in a next subset of global nets.

15. The machine readable medium of claim 14 wherein a number of conflicts within said subset exceeds a threshold so as to cause said next subset to have less nets than said subset.

16. A computing system having a machine readable storage medium with program code stored thereon that when executed by said computing system's processing resources cause a method to be performed, said method comprising:
    ranking said semiconductor chip's global nets, wherein said ranking includes at least one of the following:
    ranking power/ground nets over clock signal nets;
    ranking power/ground nets over timing/slew critical nets;
    ranking clock signal nets over timing/slew critical nets;
    ranking shorter length and lower fan-out nets over longer length and higher fan-out nets;
    identifying a subset of global nets;
    routing said subset of global nets using multiple threads, each of said global nets within said subset routed by one of said threads in isolation of said subset's other global nets;
    identifying a second subset of said global nets;
    routing said second subset of global nets using said multiple threads, each of said global nets within said second subset routed by one of said threads in isolation of said second subset's other global nets but in respect of the routes of said first subset of global nets.

17. The computing system of claim 16 further comprising geographically dispersing said subset of global nets prior to said routing of said subset of global nets.

18. The computing system of claim 17 further comprising geographically dispersing said second subset of global nets prior to said routing of said second subset of global nets.

19. The computing system of claim 16 wherein said routing said subset of global nets further comprises issuing each of said global nets to one of said threads because said one thread is available.

20. The computing system of claim 16 further comprising after said routing of said subset of global nets and before said routing of said second subset of global nets:
    detecting a conflict between a first net and a second net, said first and second nets within said first subset of global nets;
    eliminating said first net's route; and,
    including said first net in said second subset of global nets.

* * * * *